(12) United States Patent
Daves et al.

(10) Patent No.: US 7,445,141 B2
(45) Date of Patent: Nov. 4, 2008

(54) SOLDER INTERCONNECTION ARRAY WITH OPTIMAL MECHANICAL INTEGRITY

(75) Inventors: Glenn G. Daves, Fishkill, NY (US); David L. Edwards, Poughkeepsie, NY (US); Mukta G. Farooq, Hopewell Junction, NY (US); Frank L. Pompeo, Redding, CT (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 10/711,501

(22) Filed: Sep. 22, 2004

(65) Prior Publication Data

US 2006/0060636 A1 Mar. 23, 2006

(51) Int. Cl.
*B23K 31/02* (2006.01)
(52) U.S. Cl. .................. 228/180.22; 228/215; 228/178
(58) Field of Classification Search ................ 228/215, 228/178, 180.1, 180.21, 244, 180.22
See application file for complete search history.

(56) References Cited

U.S. PATENT DOCUMENTS

| 5,011,870 | A | * | 4/1991 | Peterson ..................... 523/220 |
|---|---|---|---|---|
| 5,060,844 | A | | 10/1991 | Behun et al. |
| 5,535,526 | A | * | 7/1996 | White .......................... 34/78 |
| 5,784,261 | A | | 7/1998 | Pedder |
| 5,953,814 | A | * | 9/1999 | Sozansky et al. ............... 29/840 |
| 5,968,670 | A | * | 10/1999 | Brofman et al. ............. 428/576 |
| 6,015,722 | A | | 1/2000 | Banks et al. |
| 6,048,656 | A | | 4/2000 | Akram et al. |
| 6,177,728 | B1 | | 1/2001 | Susko et al. |
| 6,294,271 | B1 | | 9/2001 | Sumita et al. |
| 6,310,120 | B1 | | 10/2001 | Shiobara et al. |
| 6,333,563 | B1 | * | 12/2001 | Jackson et al. ............... 257/778 |
| 6,506,869 | B2 | | 1/2003 | Yamaguchi et al. |
| 6,572,980 | B1 | | 6/2003 | Klemarczyk et al. |
| 6,582,993 | B1 | * | 6/2003 | Baba et al. ................... 438/118 |
| 6,586,846 | B2 | | 7/2003 | Ho |
| 6,632,704 | B2 | * | 10/2003 | Kumamoto et al. ......... 438/106 |
| 6,674,172 | B2 | * | 1/2004 | Vincent ....................... 257/777 |
| 6,697,261 | B2 | * | 2/2004 | Matsuda ...................... 361/767 |
| 6,806,560 | B2 | * | 10/2004 | Kobayashi .................. 257/676 |
| 6,841,888 | B2 | * | 1/2005 | Yan et al. ..................... 257/794 |
| 7,047,633 | B2 | * | 5/2006 | Morganelli et al. ........... 29/832 |

\* cited by examiner

*Primary Examiner*—Kevin P Kerns
*Assistant Examiner*—Michael Aboagye
(74) *Attorney, Agent, or Firm*—DeLio & Peterson, LLC; Kelly M. Nowak; Wenjie Li

(57) ABSTRACT

A method for assembling, and the resultant electronic module, includes attaching a chip to a substrate using a first solder interconnection array, and attaching a board to the substrate using a second solder interconnection array, which may be a single-melt or a dual-melt solder array. The second solder interconnection array resides entirely within a space defined between the board and substrate. A creep resistant structure is provided within this space for maintaining the defined space and optimizing integrity of the second solder interconnection array. The creep resistant structure may include an underfill material, balls, brackets, frames, collars or combinations thereof. Wherein the creep resistant structure is an underfill material, it is crucial that the substrate be attached to the board before either entirely encapsulating the second interconnection array with underfill material, or partially encapsulating the second solder interconnection array at discrete locations with underfill material.

19 Claims, 9 Drawing Sheets

SOLDER INTERCONNECTION ARRAY WITH OPTIMAL MECHANICAL INTEGRITY

BACKGROUND OF THE INVENTION

1. Field of the Invention

The present invention relates generally to the packaging and mounting of semiconductor devices in electronic circuits, and in particular, to a method and apparatus for optimizing the integrity of a solder interconnection joining a substrate to an organic circuit board.

2. Description of Related Art

Modern electronic modules include microchips and other circuit components mounted on chip carrier substrates, which in turn, are mounted to printed circuit boards. In the electronics area there is a myriad of electronic components that require connection to other electronic components, or to other levels of packaging. Examples include mounting of integrated circuit chips to a metallized substrate, multilayer ceramic substrate (MLC), laminate organic substrate, glass ceramic substrate, card (direct-chip-attach), and any substrate made of composite materials meeting thermal and mechanical properties. The use of solder to join these components is well known in the art.

For example, referring to the prior art illustration of FIG. 1A, an electronic module includes a chip 10 mounted on a chip carrier substrate 30 via a solder interconnection array 20 (i.e. C4 connections) that is encased within an underfill material 25. In a second level surface mount attachment, the chip carrier 30 is connected to a card or printed wire board 80 via another solder interconnection array 40, such as a solder ball grid array (BGA) or a solder column grid array (CGA). In this second level attachment, solder balls (or columns) are first joined to the chip carrier substrate 30 assembly to form the solder interconnection grid array 40, e.g., BGA or CGA, which is then joined to the circuit board 80. In order to dissipate heat generated during normal working conditions, a heat sink 5 may then be thermally connected to the chip 10 via a thermal interface material 7.

However, in second level attachments, substantial differences in the coefficient of thermal expansion (CTE) can exist between the board 80 and the substrate 30, as is the case when the substrate is made from a ceramic material, and the board is made from an epoxy-glass composite (e.g., FR4). During thermal cycling these CTE mismatch differences can lead to fatigue damage of the solder ball interconnections. A creep load acting in concert with thermal cycling causes creep or flattening of such solder interconnections, which can result in drastic loss of Thermo-Mechanical Fatigue (TMF) reliability, causing early opens and near-opens in the interconnect structure. Whereas a full open is a fail, even a near open can have disastrous consequences on electrical performance because of a spike in circuit resistance. Thus, the accumulation of plastic strains from repeated thermal cycling undesirably deteriorates the long-term reliability of solder joint interconnections, and ultimately leads to fatigue failure of these interconnections residing between the ceramic substrate and the board.

Further adding to fatigue failure of these solder ball interconnections are the pressures applied during the process of attaching a heat sink 5 to the electronic module. For example, clamps or other pressure bearing devices are often employed in attaching the heat sink 5 to the chip 10 via a thermal interface 7. These clamps or pressure bearing devices generate compressive forces, some of which can be high, that are exerted on the topside and underside of the electronic module, as delineated by topside arrow 91 and underside arrows 92 in FIG. 1A.

As shown in FIG. 1A, the generated compressive forces 92 are applied primarily to the extremity area of the electronic circuit, i.e., that area of the electronic module surrounding the chip 10, chip carrier 30 and solder interconnection array 40 (BGA or CGA). However, the compressive forces may also be applied under the location of the interconnection array and substrate. When the compressive forces are concentrated at the peripheral area of the solder interconnection array 40, these forces are primarily applied to the board 80 and peripheral or outer solder joints 42, which in turn, causes peripheral solder joints 42 to creep or flatten. Solder joint creep flattening undesirably deteriorates the long-term reliability of the solder joints and reduces the fatigue lifetime from thermal expansion mismatch among the various components. In extreme cases, creep flattening of the outer solder interconnections can even result in shorting of adjacent interconnections in the array, which represents catastrophic failure of the electronic module itself.

As solder interconnection array sizes increase, the actual fatigue life (time until failure) of such interconnection array decreases. Further, the fatigue life of a BGA is a function of the materials that make up the substrate, board, and interconnections, the dimensions of the substrate, interconnection and board, and also the interconnection structure. Thus, present trends towards high-powered packages, coupled with higher I/O counts, and larger interconnection arrays, creates a need for interconnections with improved fatigue life, preferably fatigue lives that are significantly greater than the reasonable expected life of the electronic module itself.

There is much prior art addressed at increasing the longevity of electronic modules. For example, referring to FIG. 1B, an interposer 60 may be provided between the substrate 30 and board 80 to enhance reliability of solder interconnection array 40. In so doing, solder interconnection array 40 is now joined to the substrate 30 and the interposer 60 and is encased within an underfill material 45 for enhancing the reliability of the interconnection grid array 40 and increasing the cyclic fatigue life of the module. A second solder interconnection grid array 70 is then provided for joining the interposer 60 to the board 80, whereby this solder interconnection grid array 70 is exposed to the environment. However, this approach is not optimal in achieving a useful product life as the second solder interconnection grid array 70 is now susceptible to the deleterious effects of peripheral solder joint 72 solder creep flattening due to the pressures applied during the process of attaching the heat sink 5 to chip 10, as well from any clamping pressure maintained for the life of the assembly. Further, the addition of an interposer undesirably adds another level of hierarchy to the continually decreasing sized modern electronic component modules.

FIG. 1C illustrates another prior art method in which the underfill material only partially encases dual melt solders adjacent the substrate 30 for allowing reworkability of the electronic module. In this approach, the underfill material is dispensed and cured before the module is attached to the board. Since the underfill material only partially encapsulates the dual melt solders, the peripheral solder joints 42 of the dual melt solder interconnection grid array 41 are exposed to the environment, i.e., not underfilled, and as such, are susceptible to the deleterious effects of solder creep flattening as shown in FIG. 1C. Further in these conventional partial underfill approaches, the dual melt solder interconnection grid array 41 is first attached to the substrate 30, and then the dual melt solders are coated with the underfill material so that the underfill material only partially covers the dual melt solder. In particular, the underfill material covers the low melt solder and only a portion of the high melt solder for holding the high melt solder in place during subsequent processing and rework. Once the dual melt solders are partially coated with underfill material, the board 80 is then attached to the module, i.e. to the non-encapsulated portions of the dual melt solders. In this manner, rework of the dual melt solder interconnection is possible.

However, these conventional approaches do not account for or mitigate fatigue stresses on the dual melt solder joints as a result of reducing the effective height of the joint. These approaches are also not useful for dual melt solder interconnections due to the eutectic solder of the dual melt solder which undergoes a 3-4% volumetric expansion upon liquation during card attach, whereby the resultant hydrostatic stresses will easily rupture the cured epoxy encapsulant. Further, these conventional approaches are not useful for single melt solders because the encapsulant will have no adhesion to the single melt solder during reflow operations.

Further, while underfill processes enhance solder interconnection reliability, they are quite sensitive to the material flow properties of the liquid resin, and their success is highly dependent upon module geometry. Modules built with larger chips, e.g., greater than 20 mm on a side, and very densely populated arrays, are more difficult to underfill than those built with smaller chips. Also, this type of processing is not easily extended to large solder interconnection grid arrays, e.g., those having solder joint gap heights (i.e., the height of the gap between the substrate to the board) of about 300 microns to about 900 microns, as is the case in solder arrays residing between a substrate and a circuit board. Problems with adhesion, gap (height) filling, voiding and flow control, particularly in solder interconnection grid arrays having gap heights ranging from about 300-900 microns, are difficult to control.

Still other approaches use stiffener or backing plates pressed against the backside of the circuit board for preventing the circuit board from flexing or bending as a result of mechanically applied pressures, as well as from thermal cycling stresses. Any flexing or bending of the circuit board ultimately leads to solder creep flattening within the solder interconnection grid array joining the substrate to the board. However, the use of backing plates undesirably increases costs of the electronic module, adds additional thickness to the assembly, increases processing steps and prevents the use of capacitors or modules at the back of the board.

Thus, a need continues to exist in the art for improved methods, and the apparatus formed by such methods, for enhancing the fatigue life of solder interconnection grid arrays that have solder joint gap heights ranging from about 300-900 microns, such as those solder interconnection grid arrays that join a substrate to a circuit board. Such methods would provide solder interconnection arrays that connect a substrate to a board with significantly enhanced fatigue resistance and overall improved reliability, and as such, provide the resultant assembly with increased longevity. That is, these methods and apparatus would preferably provide mechanically strong, stable electronic modules that are able to withstand compressive forces due to externally applied pressures, and accommodate strains generated from the thermal expansion mismatch during normal working conditions.

SUMMARY OF THE INVENTION

Bearing in mind the problems and deficiencies of the prior art, it is therefore an object of the present invention to provide methods and apparatus that facilitate joining of a substrate to a board resulting in an electronic module less prone to mechanical and electrical failure, due to both externally applied pressures and thermal cycling expansions during normal working conditions.

It is another object of the present invention to provide methods and apparatus for enhancing fatigue life properties and preventing short circuits between adjacent solder joints within a solder interconnection grid array residing between a substrate and a circuit board.

Another object of the invention is to provide methods and apparatus that impose minimal bending stresses on a circuit board, and thereby substantially avoid solder creep flattening to maintain the ball or column shape of a solder interconnection grid array residing between a substrate and the board.

A further object of the invention is to provide methods and apparatus for enhancing fatigue life of solder joints residing between a substrate and the board without adding additional thickness or hierarchy to the electronic module.

Still another object of the invention is to provide methods and apparatus for enhancing fatigue life of solder joints residing between a substrate and the board without increasing fabrication process steps.

Another object of the invention is to provide methods and apparatus for enhancing fatigue life of solder joints residing between a substrate and the board that allows for the use of capacitors or modules at the back of the board.

A further object of the invention is to provide methods and apparatus that avoid opens and/or near-opens in an interconnect structure.

It is yet another object of the present invention to provide methods of assembling and the resultant electronic modules having enhanced yield and reliability.

It is still yet another object of the present invention to provide methods of assembling and the electronic modules assembled that have improved tolerances to the thermo-mechanical expansions and contractions such that the modules maintain their integrity during thermal cycling.

Still other objects and advantages of the invention will in part be obvious and will in part be apparent from the specification.

The above and other objects, which will be apparent to those skilled in art, are achieved in the present invention, which is directed to a method for assembling an electronic module. The method includes attaching a chip to a substrate using a first solder interconnection array, and then attaching a board to the substrate using a second solder interconnection array such that a space is defined between the board and the substrate. The second solder interconnection array resides entirely within this space. A creep resistant structure is then provided within the space such that it is in direct contact with at least the board and the substrate for maintaining such space and optimizing integrity of the second solder interconnection array. The creep resistant structure may be an underfill material, a rigid metallic ball, a bracket, a frame, a collar or even combinations thereof.

In another aspect, the invention is directed to a method for assembling an electronic module that includes attaching a chip to a substrate using a first solder interconnection array, and then attaching an organic board to the substrate using a second solder interconnection array. This defines a space between the organic board and the substrate, whereby the second solder interconnection array resides entirely within such space. An underfill material is then deposited within the space such that the underfill material contacts both the organic board, the substrate and selected solder joints of the second solder interconnection array. The deposited underfill material is cured to form a rigid matrix within the space to maintain and enhance integrity of the second solder interconnection array.

The method may further include cleaning surfaces of both the organic board and the substrate within the space prior to depositing the underfill material for enhancement of adhesion of the underfill material to the organic board and the substrate. The method may also include providing at least one rigid metallic ball within the space to further maintain and enhance integrity of the second solder interconnection array, or including at least one mechanical support structure within the space to further maintain and enhance integrity of the second solder interconnection array. The mechanical support structure may include a bracket, a frame or a collar.

The second solder interconnection array may be either a single melt or a dual melt solder interconnection array. The underfill material may either entirely encapsulate the second solder interconnection array, or alternatively, partially encapsulate the second solder interconnection array at discrete locations within such second solder interconnection array. The space between the organic board and the substrate may have gap heights ranging from about 300 microns to about 900 microns, whereby the underfill material is capable of filling such gap heights.

A critical component for achieving the foregoing beneficial results of the invention is that the underfill material, in its uncured state, comprise a polymeric material having a filler material present in an amount ranging from about 60% by weight per solution to about 64% by weight per solution, with the filler material having particle sizes ranging from about 2% to about 33%, preferably from about 11% to about 20% of a gap height residing between the organic board and the substrate within the space. Also in its uncured state, the preferred underfill material has a density ranging from about 1.5 g/cc to about 2.0 g/cc, a viscosity at 25° C. greater than about 5,000 cP, and a Thixotropic Index ranging from about 1.0 to about 2.0. In its cured state, the underfill material has a glass transition temperature ranging from about 135° C. to about 145° C., and a dynamic tensile modulus strength at about 25° C. greater than about 5 Gpa. Wherein the substrate is a ceramic substrate, the cured underfill material has a CTE below Tg of about 18 ppm/° C. to about 21 ppm/° C., and a CTE above the Tg of about 85 ppm/° C. However, wherein the substrate is an organic substrate, the cured underfill material has a CTE below Tg of about 12 ppm/° C. to about 25 ppm/° C., and a CTE above the Tg of about 70 ppm/GC.

In another aspect, the invention is directed to an electronic module assembly that includes a chip attached to a substrate via a first solder interconnection array, and a board attached to the substrate via a second solder interconnection array. A space is defined between the organic board and the substrate, whereby the second solder interconnection array resides entirely within this space. An essential component of the assembly is a creep resistant structure within the space. This creep resistant structure is in direct contact with at least the board and the substrate for maintaining the space and optimizing integrity of the second solder interconnection array. The creep resistant structure may be a rigid matrix of underfill material, a metallic ball, a bracket, a frame, a collar, or even combinations thereof.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED ENBODIMENT(S)

In describing the preferred embodiment of the present invention, reference will be made herein to FIGS. 2-15 of the drawings in which like numerals refer to like features of the invention.

Figure 1A:
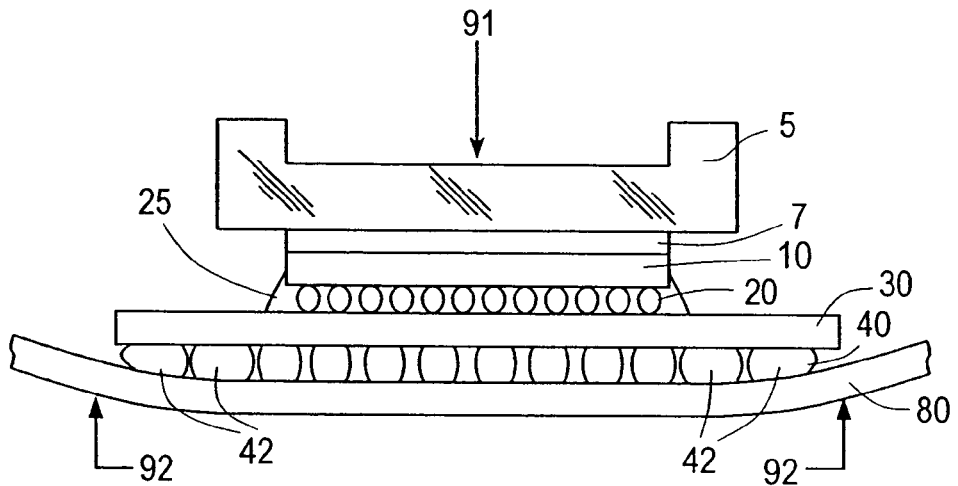
FIG. 1A is a cross-sectional view of an electronic module of the prior art showing the effects of solder creep within a solder interconnection array residing between a substrate and a circuit board.
Figure 1B:
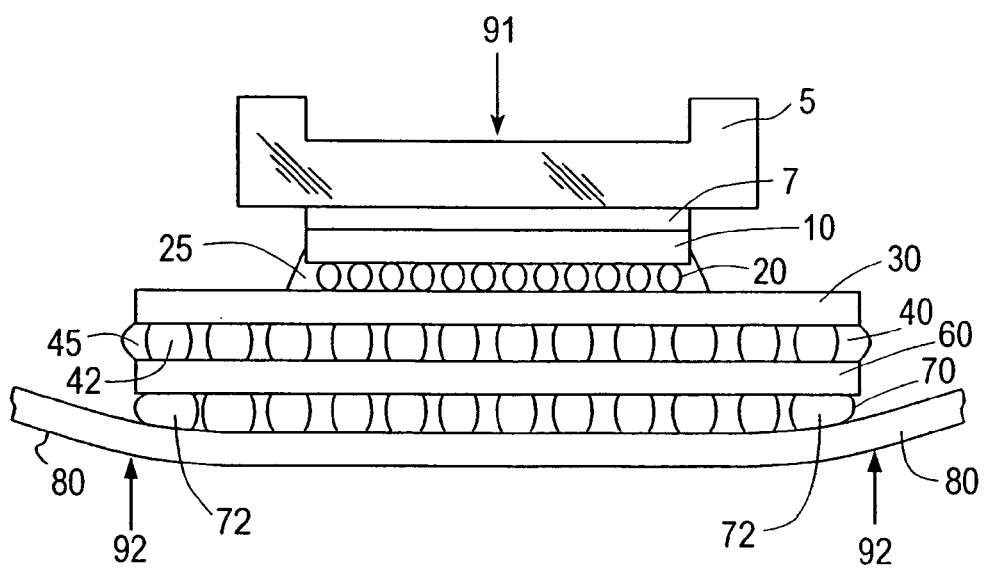
FIG. 1B is a cross-sectional view of an electronic module of the prior art showing the continuing effects of solder creep within a solder interconnection array that joins a substrate to a board when an interposer is used between the substrate and the board.
Figure 1C:
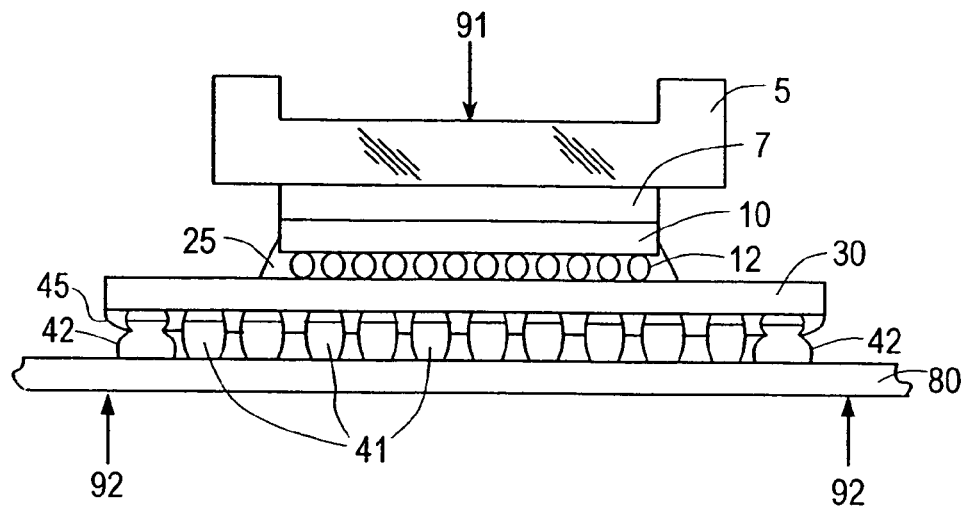
FIG. 1C is a cross-sectional view of an electronic module of the prior art showing the effects of solder creep within a partial portion of a solder interconnection array that joins a substrate to a board.
Figure 2:
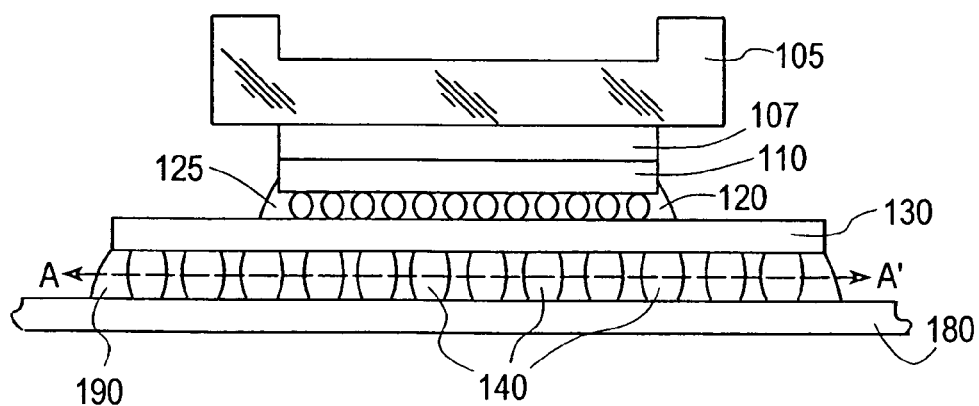
FIG. 2 is a cross-sectional view of an electronic module of the invention whereby the solder interconnection grid array residing between the board and the chip carrier substrate is encapsulated within an underfill material of the invention for providing the module with enhanced fatigue and load enhancement.

Referring to FIG. 2, an electronic module is shown that includes a chip 110 mounted on a substrate or chip carrier 130 by known mounting means, such as a solder interconnection grid array 120, e.g., C4 connections 120. A chip underfill material 125 encapsulates at least a portion, and preferably all, of the C4 connections 120 to improve the solder ball fatigue reliability and to provide an effective barrier against environmental and process exposures. This chip underfill material 125 may include any known underfill material for encapsulating solder interconnections between a chip and a substrate. The substrate 130 may comprise a ceramic substrate, an organic substrate, a silicon substrate or a variety of other known substrate materials.

Once the chip is joined to the chip carrier substrate 130, a second level attachment joins the chip carrier substrate to a card or printed circuit board 180. As shown in FIG. 2, a second solder interconnection grid array 140 is used to join the substrate 130 to the board 180 by known techniques. The circuit board 180 may be a dense printed wire board having numerous electrical components thereon. The solder interconnection grid array 140 may include a BGA, CGA, and the like, and may be composed of any known single-melt solder material or dual-melt solder material. The solder interconnection grid array 140 may be reflowed using known equipment and methods to join the substrate 130 to the board 180.

Figure 3:
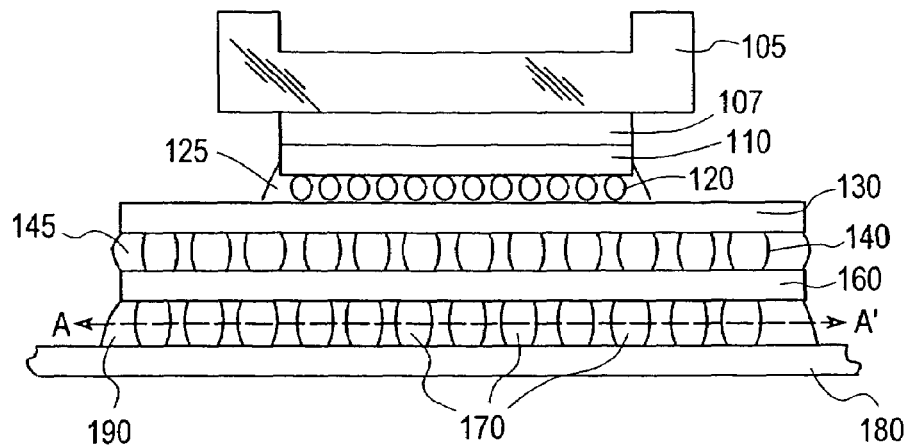
FIG. 3 is a cross-sectional view of an electronic module of the invention having an interposer whereby the solder interconnection grid array residing between the board and the interposer is encapsulated within an underfill material of the invention for providing the module with enhanced fatigue and load enhancement.

Referring to FIG. 3, optionally, in order to enhance mechanical reliability of solder interconnection grid array 140 and the module itself, an interposer 160 may be disposed between the substrate 130 and the board 180. This interposer may be formed by known techniques, and may be composed of known ceramic or other materials, but preferably is an organic material. As is shown in FIG. 3, the interposer 160 is positioned such that the solder interconnection grid array 140 is connected to a top surface of the interposer 160 for joining the substrate to the interposer. An underfill material 145 is then provided to encapsulate the interconnection grid array 140 and enhance the reliability thereof. The electronic module may be heated to cure the underfill material 145 to provide a rigid matrix that increases the rigidity and strength of the electronic module.

Upon completion of attaching the interposer 160 to the module, another solder interconnection grid array 170 is provided to join the interposer 160 to the board 180. Solder joints are first attached to the interposer 160 to form the solder interconnection grid array 170. The solder interconnection grid array 170 is then attached to the board 180. In accordance with the invention, the solder joints of solder interconnection grid array 170 may be either single-melt or dual-melt solder joints, and are reflowed using known equipment and methods to join the interposer 160 to the board 180. Both solder interconnection grid array 140 and 170 may include solder BGA configurations, solder CGA configurations, and the like.

In order to dissipate heat generated during normal operating conditions of the above electronic modules, a heat sink 105 may be attached to the chip 110 using a thermal interface material 107 for providing a thermal connection there between such components. This thermal interface material 107 may include, but is not limited to, a thermal paste, a thermal pad, an adhesive, a phase change material, and the like. In attaching the heat sink, compressive forces are applied to thermally connect the heat sink 105 to the chip 110. However, in doing so, the large solder interconnection grid array 140 joining the substrate 130 to the board 180, or the large solder interconnection grid array 170 joining interposer 160 to the board 180, both of which have gap heights ranging from about 300-900 microns, are susceptible to the destructive results due to solder joint creeping or flattening, as well as decreased fatigue resistance. As these compressive forces are primarily focused at peripheral edges, the outer most solder joints residing at these peripheral edges of the solder interconnection grid arrays 140 or 170 are most susceptible to damage by solder creep or flattening, and decreased fatigue resistance. After assembly, the force on the heatsink may be removed, for example if an adhesive is used, or the clamping force may remain for the life of the product, for example when thermal paste is used.

Typical compressive forces applied to an electronic module for joining the heat sink to the chip, and/or during the life of the module, may reach as high as about 100 pounds exerted over a solder interconnection grid array 140 or 170 area (e.g., BGA area) of 24×24 balls. This results in an average compressive force of about 72 g per solder ball within the BGA 140 or 170. Under these pressures, the solder ball, and in particular peripheral solder balls (which experience a significantly higher force than the aforementioned average compressive force), become distorted causing solder creep or flattening. This ultimately leads to collapse of the structure and failure of the module. With extreme solder creep or flattening, shorting may occur between neighboring solder joints due to the deformed solder ball having a maximum diameter equal to or greater than the BGA pitch.

Further adding to the strains on solder interconnection grid arrays 140 and 170 are any substantial differences in the coefficient of thermal expansion (CTE) existing between the electronic module component being attached to the circuit board, e.g., substrates 30 or interposer 160, and the circuit board 180 itself. For example, where the component being attached to the circuit board is composed of a ceramic material and the circuit board is of an organic material, substantial differences in the CTE will exist as a result of the thermal cycling during operation. This thermal cycling exerts cyclic strains on the solder interconnection grid array 140 or 170. Any solder joint creeping within the solder interconnection grid array 140 or 170, caused by external mechanical load pressures in combination with cyclic strains exerted by the CTE mismatch, can result in drastic loss of Thermo-Mechanical Failure (TMF) reliability which deteriorates the long-term reliability of the solder joint interconnections and can ultimately lead to fatigue failure of the solder interconnection grid array 140 or 170.

In accordance with the invention, the solder interconnection grid array 140 joining the substrate 130 to the board 180, or the solder interconnection grid array 170 joining interposer 160 to the board 180, are encapsulated within an underfill material 190 that has suitable properties and characteristics for allowing the underfill material to entirely fill the large gap heights, e.g., those ranging from about 300-900 microns, within the solder interconnections 140 or 170. A critical feature of the invention is that the substrate 130 be attached to the board 180 via solder interconnection grid array 140, or the interposer 160 be attached to the board 180 via solder interconnection grid array 170, prior to depositing the underfill material 190 within such solder interconnections 140 or 170. It is also preferred that the underfill material 190 be deposited within solder interconnections 140 or 170 prior to attaching the electronic module to the heat sink 105, or applying compressive forces (some of which may be high compressive forces) to the electronic module, for protecting and providing mechanical and structural stability to solder interconnection grid array 140 or 170.

An essential feature of the underfill material 190 is that it be able to fully encapsulate solder interconnection grid arrays 140 or 170, having gap heights ranging from about 300-900, while substantially avoiding poor adhesion, gap filling problems, voiding and/or inadequate flow control. In accordance with the invention, the underfill material 190 is composed of a resilient polymeric material that has sufficient flowability in its uncured state for allowing the material to flow evenly into and completely fill the gaps within solder interconnection grid arrays 140 or 170. Further, in its cured state, the preferred resilient polymeric material has sufficient rigidity and strength for protecting the solder interconnection grid array by withstanding the forces and pressures applied as a result of thermally-induced strains from CTE mismatches, and high compressive externally-applied mechanical loads and pressures applied both during assembly and during the life of the electronic module.

For ease of describing the broad range of resilient underfill materials 190 for use in accordance with the invention, the preferred underfill materials 190 are described in relation to their required chemical and physical properties before and after curing the underfill material.

In its uncured, liquid state, the preferred underfill material 190 comprises a polymeric material having a filler material, such as, silica, and the like, residing throughout the polymeric material. The filler material is preferably present in an amount ranging from about 60% (by weight) per solution to about 64% (by weight) per solution, and has a particle size that is about 2% to about 33%, preferably from about 11% to about 20% of the gap height to be filled. For example, wherein the gap heights within the solder interconnection grid arrays 140, 170 of the single or dual melt solders range from about 300 microns to about 900 microns, the filler particle sizes may range from about 32 microns to about 300 microns in diameter, preferably from about 32 microns to about 180 microns. It has been found that filler particle sizes below these ranges, and particularly, below 32 microns, do not adequately and completely fill the larger gaps residing within the interconnection grid array that joins the electronic module to the board. Therefore, the preferred underfill should have an average particle size of approximately 32 microns to about 180 microns, with maximum particle size equal to approximately 300 microns to preserve good capillary flow and filling potential.

The density of the uncured underfill material 190 preferably ranges from about 1.5 g/cc to about 2.0 g/cc, with a viscosity at 25° C. greater than about 5,000 cP, preferably ranging from about 7,500 cP to about 20,000 cP. Viscosities less than these measures do not allow for complete filling of the larger gaps discussed above within the solder interconnection grid array 140 or 170. The preferred uncured underfill material also has a Thixotropic Index ranging from about 1.0 to about 2.0, whereby the Thixotropic Index is defined as "viscosity at 0.5 rpm viscosity at 5 rpm", measured using a Brookfield Cone & Plate #CP51 Spindle, from Brookfield®, Middleboro, Mass. The larger filler particle sizes of the invention beneficially control both viscosity and flow speed parameters during the step of dispensing the liquid underfill material 190, while avoiding gap filling and flow control problems on the board associated with underfill materials used to fill smaller gap heights, such as those gaps having heights ranging about 75 microns to about 250 microns. These properties of the uncured underfill material 190 allow both entire gap-filling of all the solder joints (i.e., filling all gaps between the substrate (substrates 30 or interposer 160) and the board 180 residing within solder interconnection grid arrays 140, 170), or selective gap-filling of only selected solder joints without precipitous flow-out and swamping of nearest neighbor components nor tendency to produce voids.

The filler particle size is an essential feature of the invention as it is crucial to have sufficiently sized particles for filling the larger gap heights ranging from about 300-900 microns (or, about 12 mils to about 35 mils) residing within solder interconnection grid arrays 140 or 170. Conventional underfill materials having filler particle sizes ranging from about 1 micron to about 25 microns in diameter are commonly used to underfill the smaller gap dimensions (i.e., gap heights and joint pitch (center-to-center distance between adjacent solder joints)) in a flip-chip interconnection (e.g., BGA 20), whereby these smaller gap dimensions may range in height from about 75 microns to about 190 microns. However, it has been found that such conventional underfill materials are inadequate as underfill materials for the larger, taller interconnection grid arrays of 140 and/or 170, as conventional underfill materials precipitously flow-out from these larger, taller interconnection grid arrays, and thereby leave gaps or voids within such interconnection grid arrays such that the interconnection grid arrays are not entirely encapsulated.

In accordance with the invention, after the board 180 has been joined to the substrate 130 via solder interconnection grid array 140 or interposer 160 via solder interconnection grid array 170, the surfaces within solder interconnection grid arrays 140 or 170, including the substrate and board surfaces, or the interposer and board surfaces, are cleaned prior to depositing the underfill material 190 therein. In the preferred embodiment, solder interconnection array 140 or 170 is attached to the substrate 130 or interposer 160, respectively, and to the board 180 using a cleanable solder paste or flux. After this attachment is complete, interconnection array 140 or 170 is cleaned with either de-ionized water, when a water clean paste is used, or by an appropriate solvent, for example when a rosin based flux is used. If one desires, a pre-cleaning step may be avoided if no clean paste or flux is used when joining the substrate 130 to the board 180 via solder interconnection array 140, or interposer 160 to the board 180 via solder interconnection array 170. However, pre-cleaning the assembly components prior to depositing the underfill material 190 within solder interconnection array 140 or 170 advantageously increases the adhesion of the underfill to the various components, thereby enhancing the reliability benefit in cyclic fatigue. Once cleaning is complete, the preferred underfill material 190 may then be applied directly between the board 180 and substrate 130, as shown in FIG. 2, or between the board 180 and interposer 160, as shown in FIG. 3.

Prior to providing the underfill material 190, the electronic module assembly, including the printed circuit board 180, is placed within a processing chamber, and the chamber and assembly are preheated to a temperature ranging from about 75° C. to about 95° C. The liquid underfill material 190 is then deposited directly onto the heated board 180. This may be accomplished by dispensing the liquid underfill material 190 from a liquid dispensing apparatus, such as, a dispensing needle. The liquid underfill material 190 may be deposited onto the board in a single location of the solder interconnection grid array, at multiple locations simultaneously or concurrently along the solder interconnection grid array, or even by moving the dispensing tool along edges of the interconnection grid array for dispensing the liquid underfill material along such entire edge.

Figure 4:
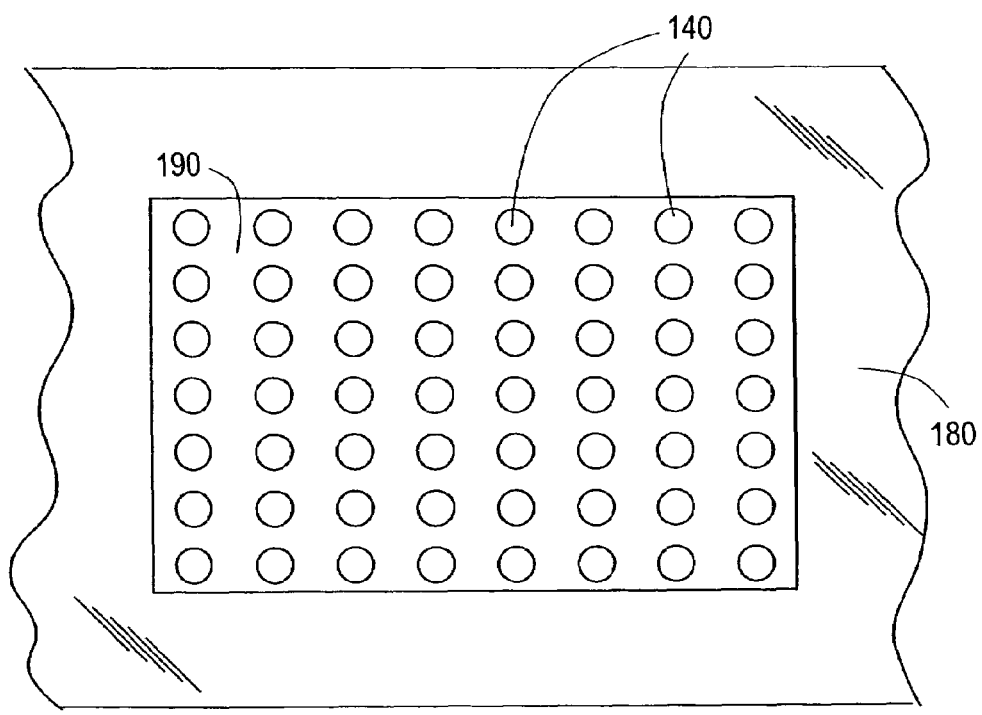
FIG. 4 is a top down view along line A-A' of FIGS. 2 and 3 showing the underfill material of the invention fully encapsulating the solder interconnection grid array residing between the board and interposer or substrate.
Figure 7:
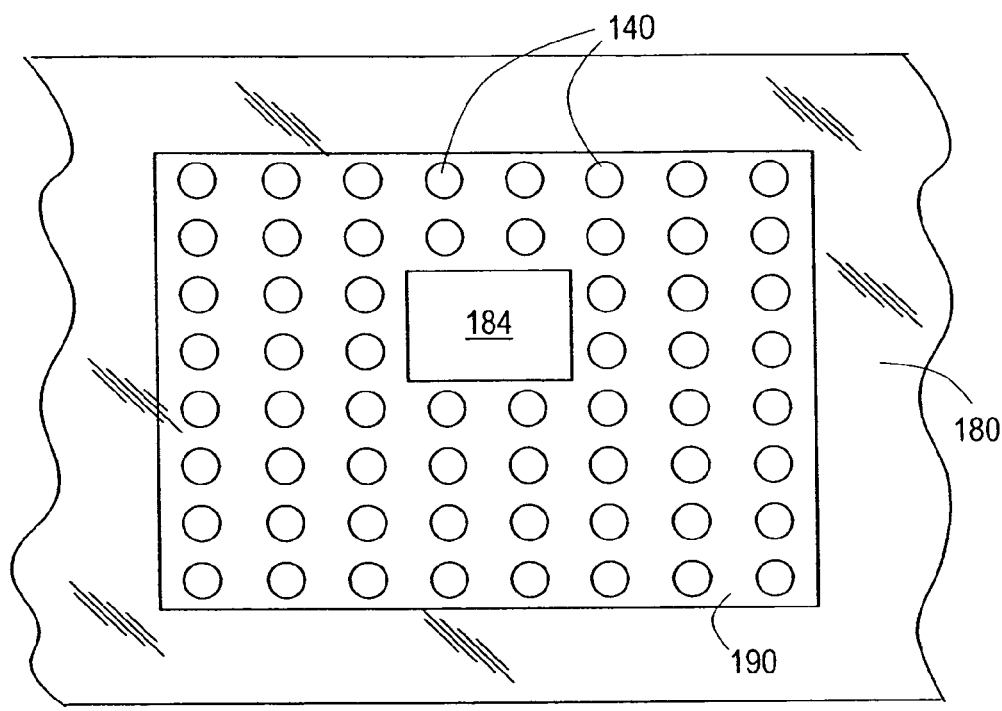
FIG. 7 is still another alternate top down view along line A-A' showing the underfill material of the invention encapsulating the solder interconnection grid array residing between the board and interposer or substrate with a central opening through the card.

Depending upon how the liquid underfill material 190 is deposited onto the heated circuit board 180, the underfill material 190 may entirely encapsulate the interconnection grid array, as shown in FIGS. 4 and 7. Referring to FIG. 7, the board 180 may have a hole or opening 184 therein for capacitors or other devices. In such an embodiment, the underfill material 190 may fully encapsulate the interconnection grid array residing around the opening 184 in the board 180.

Figure 5:
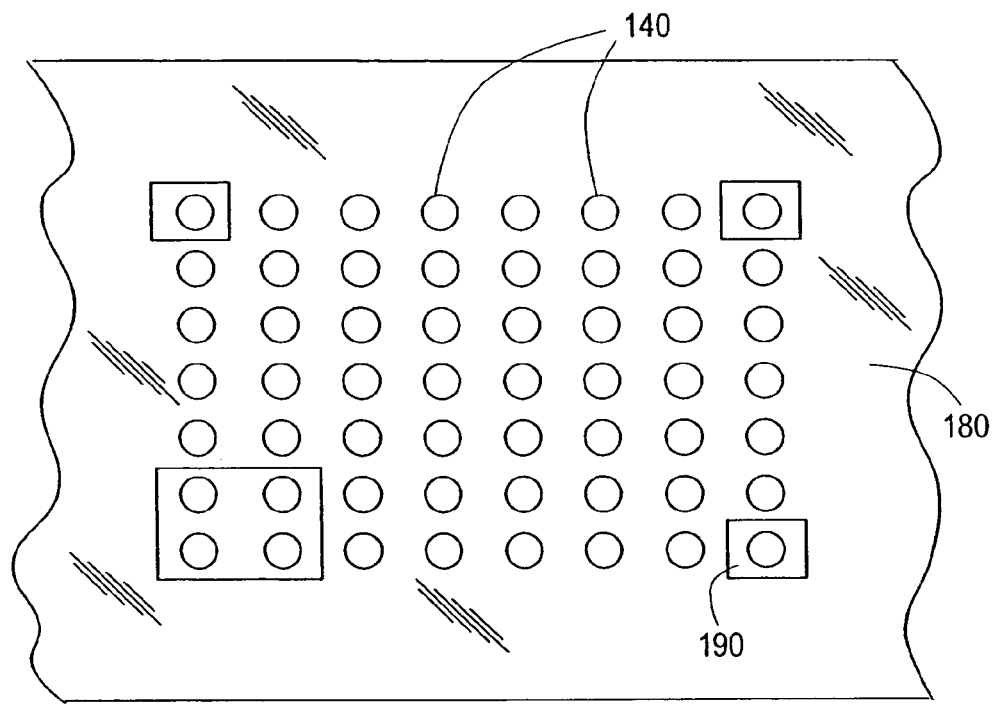
FIG. 5 is an alternate top down view of the underfill material of the invention encapsulating only the corners of the solder interconnection grid array residing between the board and interposer or substrate.
Figure 6:
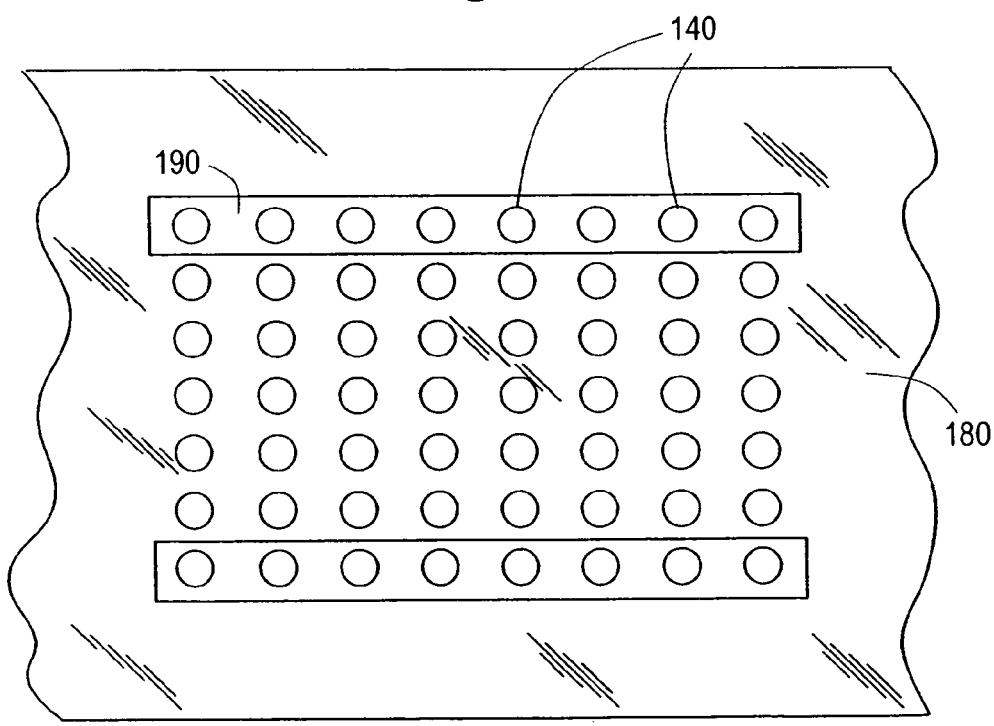
FIG. 6 is another alternate top down view along line A-A' showing the underfill material of the invention encapsulating only parallel, external edges of the solder interconnection grid array residing between the board and interposer or substrate.

Alternatively, the liquid underfill material 190 may be dispensed only at specific locations of the interconnection grid array to partially encapsulate the interconnection grid array, as is shown in FIGS. 5 and 6. For example, the underfill material 190 may be dispensed only at or near each of the four corners of the solder interconnection grid array so that only these four corners are underfilled. In so doing, only the corner-most solder interconnection may be underfilled or a set of corner solder interconnection may be underfilled as shown in FIG. 5. As another alternative, the liquid underfill material 190 may be dispensed and deposited only at, or along, parallel edges of the solder interconnection grid array so that only these parallel edges of the interconnection array are underfilled, as shown in FIG. 6. Both the corner and parallel edges fills of the invention are achievable due to both the high viscosity and the high strength of the preferred underfill material, as well as to the ease of applying the underfill material to only specific locations or along edges of the interconnection. The underfilling shown in FIGS. 5 and 6 provide sufficient strength and rigidity to the peripheral and corner interconnections of solder interconnection grid arrays 140 and 170 (which are most susceptible to cyclic fatigue and high compressive loads from card flexing) from subsequently applied compressive forces. They also require less time to dispense the underfill material, which achieves higher tool throughputs, and require less real estate on the board for allowing capacitors to be positioned closer to the middle of the module.

In applying the liquid underfill material 190 directly to the pre-heated printed circuit board 180, heat from the pre-heated printed circuit board 180 increases the liquid underfill material's wetting characteristics. By increasing its wetting characteristics, the energetic gain at the connection between the underfill material and the heated board provides the underfill material with increased capillary action to accelerate the application thereof. This increased capillary action also allows the underfill material to be efficiently drawn into the interconnection grid array 140 or 170 for underfilling the empty spaces between each solder joint, and between the substrate (or interposer) and the printed circuit board, in the desired pattern as discussed above in relation to FIGS. 4-7. In completely underfilling the interconnection grid array as shown in FIGS. 4 and 7, the underfill material 190 is deposited onto the heated board 180 for a time sufficient to allow the solder interconnection grid array be entirely encapsulated within the underfill material or until visible fillets of underfill material are observed at the external edges of the interconnection grid array, which indicates that the interconnection grid array is entirely encapsulated. Referring to FIGS. 5 and 6, in partially underfilling the interconnection grid array, i.e. underfilling only the four corners or parallel edges of the solder interconnection grid array, the underfill material 190 is deposited onto the heated board 180 for a predetermined amount of time sufficient to underfill the interconnection grid array in such manners.

Once the liquid underfill material entirely encapsulates the solder interconnection grid array, the electronic module may be positioned in a heating apparatus for curing the liquid underfill material 190 to encapsulate the interconnection grid array connected to the board within a rigid, resilient polymer matrix capable of withstanding the high mechanical loading pressures during subsequent operations, such as during attaching the heat sink 105 to the chip. Preferably, the module is placed within a heating apparatus to heat the entire module and card sub-assembly to a temperature ranging from about 150° C. to about 175° C. for a time sufficient to allow full cross-linking (curing) of the underfill material. More preferably, the module is heated for a time ranging from about 30 minutes to about 60 minutes to arrive at a mechanically stable structure upon curing the encapsulant.

In accordance with the invention, the properties of the cured underfill material 190 include a glass transition temperature (Tg) ranging from about 135° C. to about 145° C., and a dynamic tensile modulus strength at about 25° C. greater than about 5 Gpa, preferably ranging from about 8 Gpa to about 10 Gpa. Wherein the substrate 130 or interposer 160 comprises a ceramic material, the cured preferred underfill material 190 has a CTE below Tg of about 18 ppm/° C. to about 21 ppm/° C. (preferably not greater than about 25 ppm/° C.), and a CTE above the Tg of about 85 ppm/° C. When the substrate 130 or interposer 160 comprises an organic material, the cured preferred underfill material 190 has a CTE below Tg of about 12 ppm/° C. to about 25 ppm/° C., and a CTE above the Tg of about 70 ppm/° C. The foregoing cured properties of the underfill material 190 are beneficial for connecting electronic module components to printed circuit boards, while providing the resultant structure with enhanced strength and stability. An example of the preferred underfill material 190 of the invention is an epoxy underfill material, such as ABLEFILL™ JM8806 by Ablestik (Rancho Dominguez, Calif.).

Figure 8:
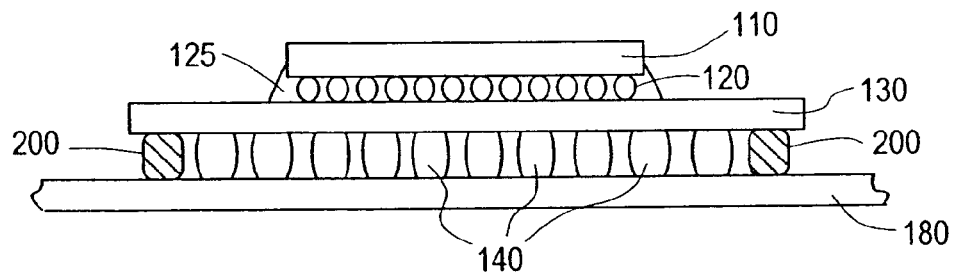
FIG. 8 is a cross-sectional view of an electronic module of the invention having rigid metallic balls within the solder interconnection grid array residing between the module and board for providing the electronic module with improved creep resistance.
Figure 9:
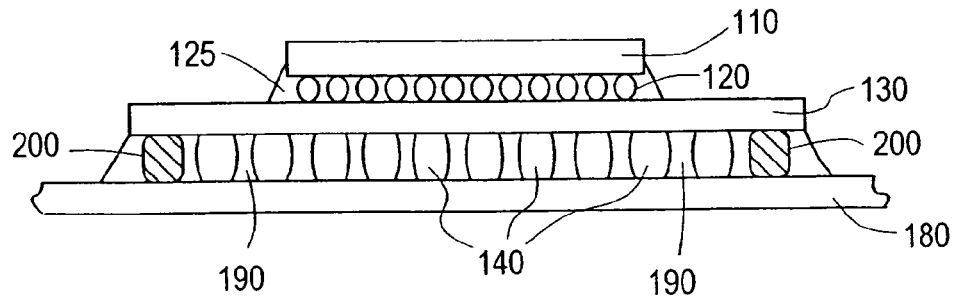
FIG. 9 is a cross-sectional view of the electronic module of FIG. 8 showing the module having rigid metallic balls in combination with the underfill material of the invention for providing the module with improved creep resistance in combination with enhanced fatigue and load enhancement.

As an alternative, one or more substantially rigid metallic balls 200 may be positioned at desired locations within the solder interconnection grid arrays 140 and 170. Referring to FIGS. 8 and 9, these metallic balls 200 may include, but are not limited to, copper balls, copper alloy balls, a variety of other solderable alloys, or even combinations thereof. The metallic balls 200 may be positioned such that they are located at specific locations on either the substrate 130 or interposer 160, or even on the board 180, before joining the substrate 130 or interposer 160 to the board via solder interconnection grid arrays 140 and 170, respectively. The desired locations of such metallic balls 200 are selected based on model predictions of locations that will have the highest creep point, thereby reducing the creep risk of solder joints within solder interconnection grid arrays 140 or 170. That is, the use of one or more substantially rigid metallic balls 200 within solder interconnection grid arrays 140 or 170 improves creep resistance of such solder interconnections. For example, one or more copper balls 200, having appropriate height and size so as to allow assembly of all other electrically valid joints while taking into account the ceramic substrate chamber, may be positioned on the ceramic substrate in locations that depend on the available redundant ground/power and the mechanical model results.

The use of the one or more substantially rigid metallic balls 200 within solder interconnection grid arrays 140 or 170 may be alone, as shown in FIG. 8, or may be used in combination with underfill material 190 that entirely encapsulates, as shown in FIG. 9, or partially encapsulates the solder interconnection at specific locations. Wherein the assembly is provided with both one or more substantially rigid metallic balls 200 in combination with underfill material 190 (FIG. 9), the assembly is advantageously provided with both improved creep resistance and fatigue enhancement. In so doing, a critical feature is that the solder interconnection grid arrays and the rigid metallic balls be attached first to either the substrate, interposer, board or alternating surfaces thereof, and then once attached, the substrate or interposer is attached to the board via the solder interconnection grid arrays and rigid metallic balls. The assembly is then preferably cleaned to improve adhesion of the underfill material, and finally the underfill material is provided between the substrate (or interposer) and board in a sufficient amount such that it either fully encapsulates the solder interconnection or partially encapsulates the solder interconnection at specific locations while adhering sufficiently strongly to surfaces of both the substrate (or interposer) and board.

Referring to FIGS. 10-14C, mechanical support structures, such as, support brackets or frames 300 (FIGS. 10-12C) or collars 400 (FIGS. 13-14C) may be used as a hard stop between the module and the board to relieve compressive loads within the solder interconnections 140 or 170. These mechanical support structures (brackets, frames, collars, and the like) may be placed, glued or soldered in specific locations on the substrate (or interposer) or the board. After assembly is completed, these mechanical support structures may be in direct contact with both the board and the substrate (or interposer), or alternatively, the mechanical support structures may contact only the board, substrate or interposer, thereby leaving a gap between the mechanical support structures and the opposing surface (i.e., board, substrate or interposer) to maintain high yields.

Figure 14A:
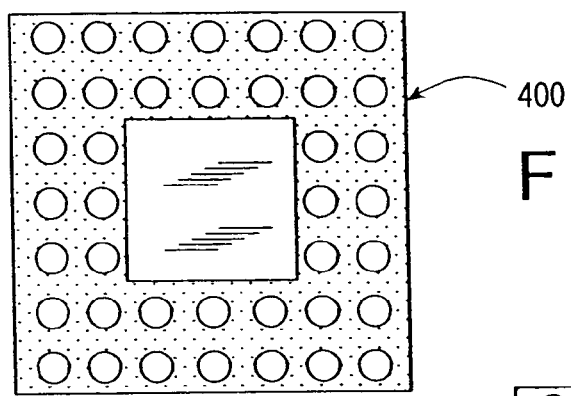
FIGS. 14A-14C are top down views showing the alternate support collars referred to in FIG. 13 for use in accordance with the invention.
Figure 14B:
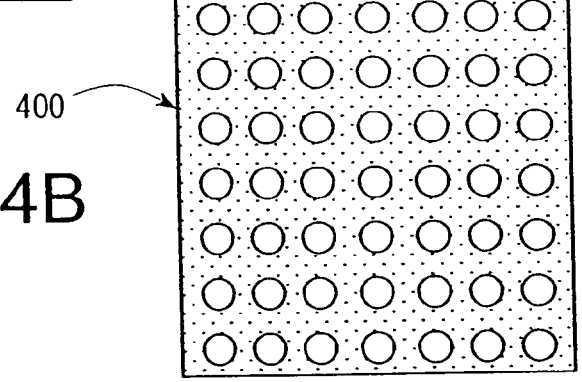
Figure 14C:
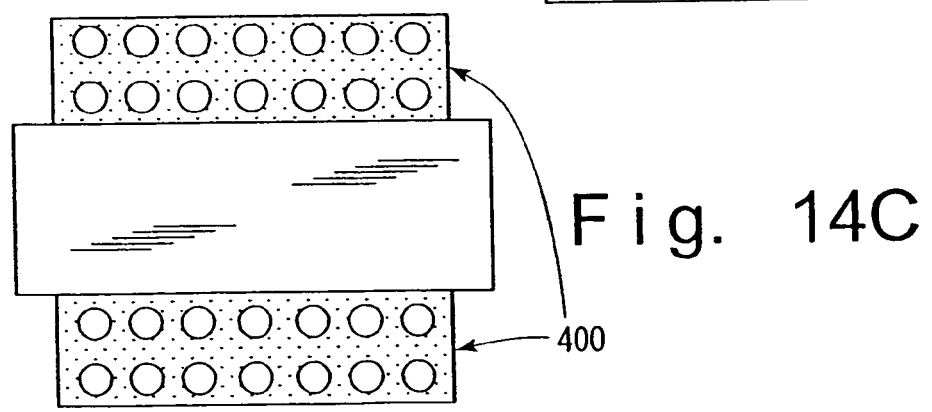

Depending upon the mechanical support structure chosen, it should be appreciated to one skilled in the art that the brackets, frames or collars may be provided within the assembly either before or after attaching the substrate (or interposer) to the board. Wherein the brackets, frames or collars are provided prior to attaching the substrate (or interposer) to the board, the brackets, frames or collars may be rigid structure(s) that are attached to the substrate, interposer or board prior to the joining thereof. Alternatively, wherein the brackets, frames or collars are provided after joining the substrate (or interposer) to the board, a high viscosity liquid (such as any known barrier material) may be deposited within the solder interconnection grid array 140 or 170 that joins the substrate (or interposer) to the board. This high viscosity liquid is deposited in locations where it is desired that the brackets, frames or collars be formed. These locations are preferably based on model predictions of locations that will have the highest creep point, thereby reducing the creep risk of solder joints within solder interconnection grid arrays 140 or 170. Once enough material is deposited in the desired locations, such that the material contacts surfaces of both the substrate (or interposer) and the board, the deposited high viscosity liquid is then cured to form the structurally rigid support brackets or frames 300 or support collars 400. The brackets or frames 300 may be provided as full perimeter structures (FIG. 12A), opposite edge structures (FIG. 12B), or even corner segment structures (FIG. 12C), while the collars 400 may be provided as a structure of a partial array of holes (FIG. 14A), a structure of a full array of holes (FIG. 14B) or separate segment structures each having an array of holes (FIG. 14C).

Figure 10:
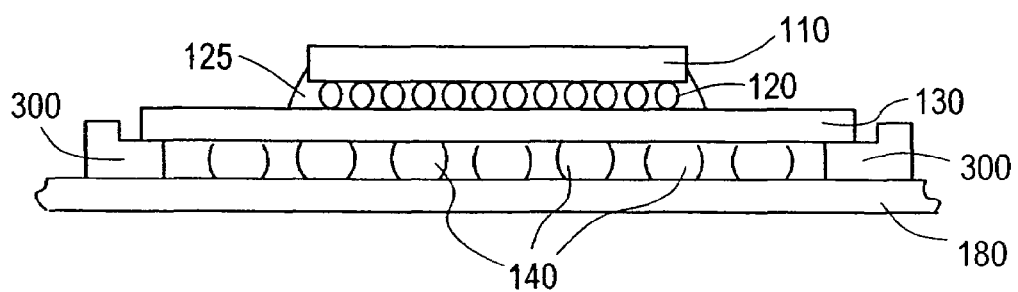
FIG. 10 is a cross-sectional view of an electronic module of the invention having support brackets or frames within the solder interconnection grid array residing between the module and board for providing the electronic module with improved creep resistance.
Figure 11:
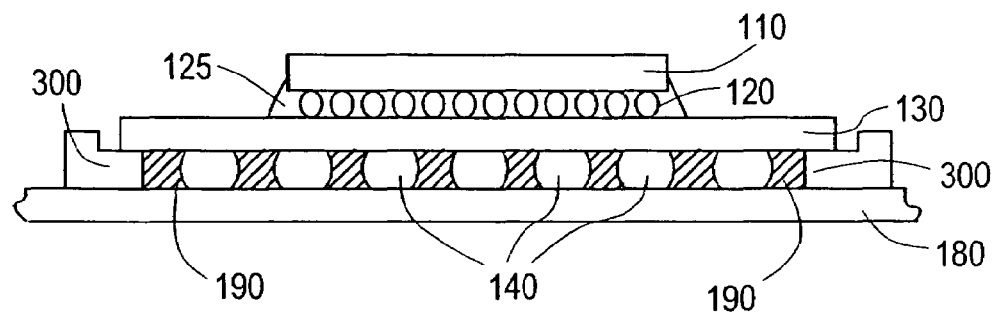
FIG. 11 is a cross-sectional view of the electronic module of FIG. 10 showing the module having support brackets or frames in combination with the underfill material of the invention for providing the module with improved creep resistance in combination with enhanced fatigue and load enhancement.
Figure 12A:
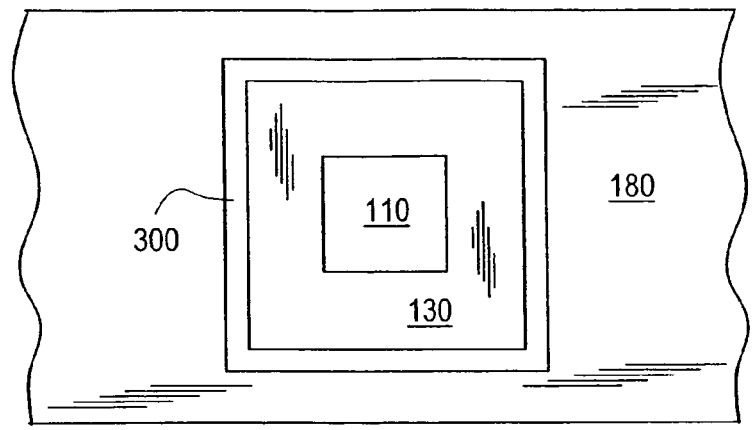
FIGS. 12A-12C are top down views showing the alternate support brackets or frames referred to in FIGS. 10 and 11 for use in accordance with the invention.
Figure 12B:
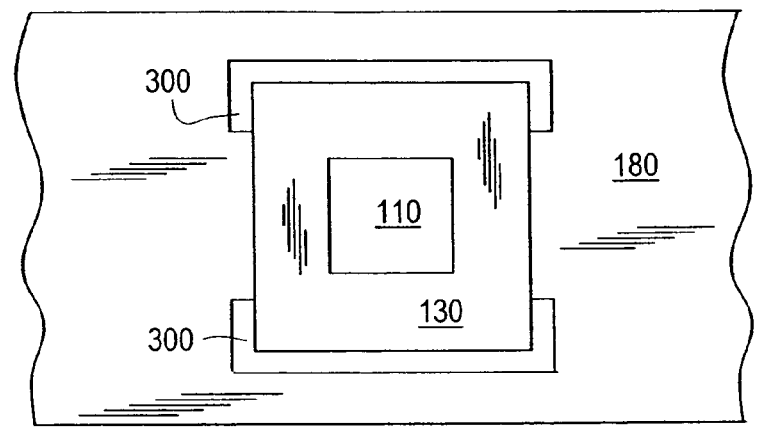
Figure 12C:
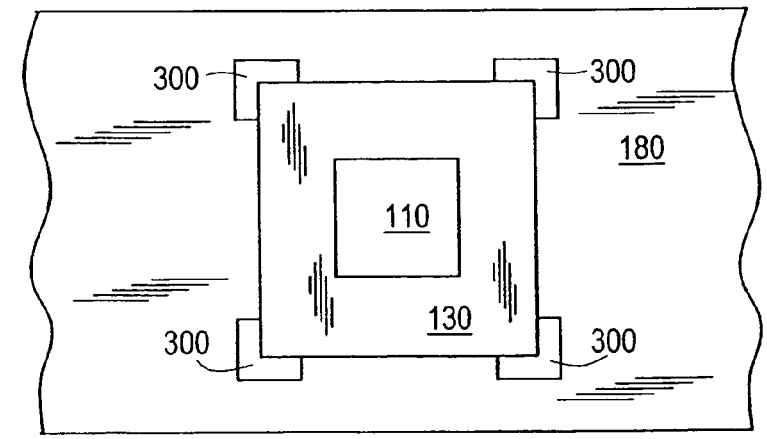
Figure 13:
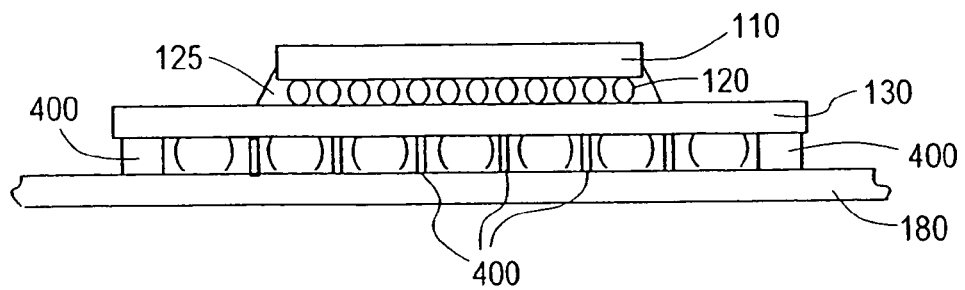
FIG. 13 is a cross-sectional view of an electronic module of the invention having support collars within the solder interconnection grid array residing between the module and board for providing the electronic module with improved creep resistance.

Similar to that of the copper balls 200, the support brackets or frames 300 may be used alone, as shown in FIG. 10, or may be used in combination with underfill material 190 that entirely encapsulates (shown in FIG. 11) or partially encapsulates the solder interconnection grid array at specific locations. Likewise, the collars 400 may be used alone, as shown in FIG. 13, or may be used in combination with underfill material that entirely or partially encapsulates the solder interconnection grid array. Wherein an assembly is provided with support brackets, frames or collars in combination with underfill material 190, such assembly is advantageously provided with both improved creep resistance due to the support brackets, frames or collars and fatigue enhancement due to the underfill material. The brackets, frames or collars also assist in ensuring that the underfill material remains within the solder interconnection grid array. Once the assembly is provided with brackets, frames or collars, the assembly is preferably cleaned as discussed above prior to depositing the underfill material 190 for improving the adhesion thereof to surfaces of both the module underside and the board.

Once the solder interconnection grid arrays 140 or 170 are either entirely encapsulated or partially encapsulated at specific locations within the grid array using underfill material 190, and optionally rigid metallic balls, support brackets, support frames or support collars are provided between the module and the board, the assembly may be further processed in accordance with known processing techniques. During such processing, and for the life of the module, the optimized underfilled interconnection grid arrays 140, 170 in accordance with the invention provide the electronic module with enhanced ability to survive cycling. It also provides the modules with fatigue enhancement and load enhancement from compressive loads (i.e., pressures applied vertical to the plane of the interconnection), particularly high compressive loads, and shear loads (i.e., pressures applied horizontal to the plane of the interconnection, such as slipping the substrate against the board) generated during subsequent processing, such as during attaching the heat sink to the module. The invention advantageously allows the electronic modules, and the interconnection grid arrays 140, 170, to withstand these high pressure loads without requiring the use or assistance of conventional backing plates. Also, the invention is beneficially useful for joining ceramics to organics, ceramics to ceramics and organics to organics, when used with either single-melt or dual-melt solder interconnection grid arrays, such as BGAs or CGAs. By fully or partially encapsulating the solder interconnection grid arrays 140 or 170 with underfill material 190 after the module is attached to the board, or providing rigid balls, brackets, frames, or collars, alone or in combination with underfill material 190 which is provided within solder interconnection grid arrays 140 or 170 after the module is attached to the board, these interconnections and the resultant electronic module itself are provided with additional support, strength and durability, thereby reducing the forces and loads applied to the peripheral solder joints and thus advantageously prevent creep flattening thereof. Again, a critical feature of the invention is that the underfill material 190 is provided within the solder interconnection grid arrays 140 or 170 after the module is attached to the board and the components are cleaned, such that the underfill material 190 adheres sufficiently strongly to surfaces of both the module underside and the printed circuit board for controlling shear stresses therebetween.

Figure 15:
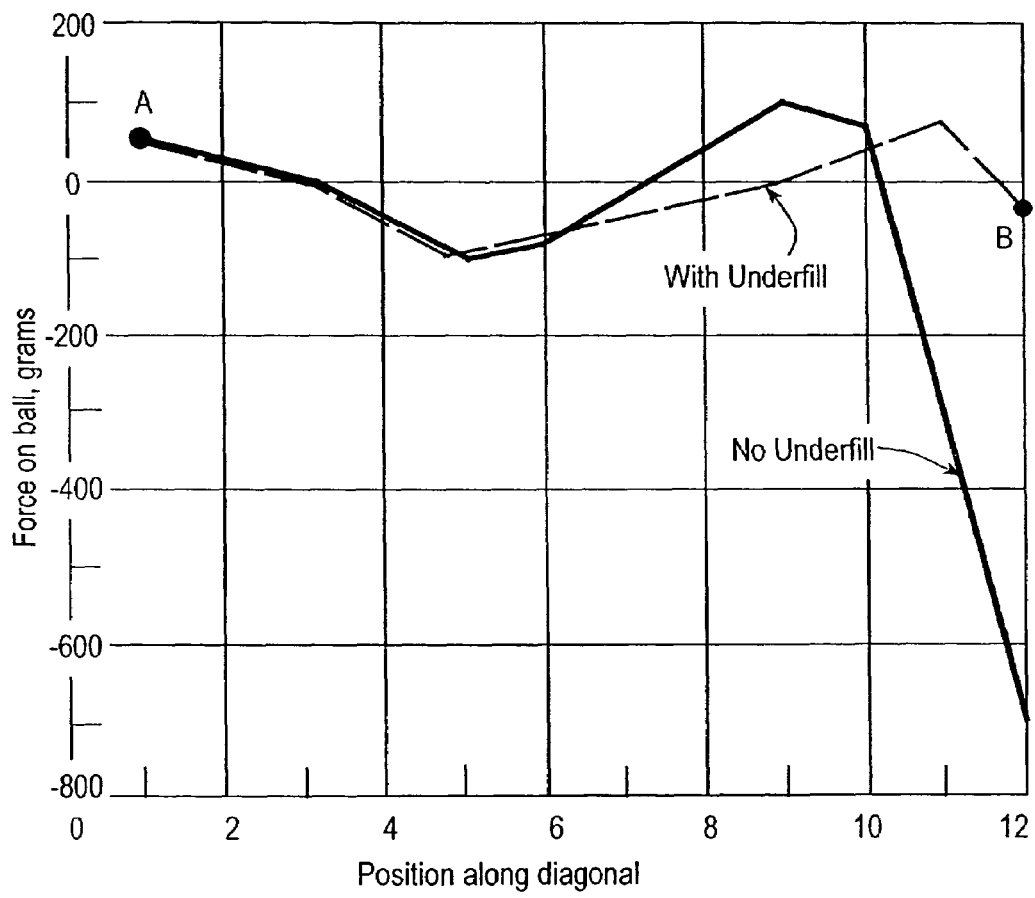
FIG. 15 is a graphical representation of the comparative results of an underfilled solder interconnection grid array residing between a board and a substrate in accordance with the present invention versus a non-underfilled solder interconnection grid array residing between a board and substrate.

FIG. 15 is a graphical representation depicting the comparative results of the solder joint load (such as BGA load) reductions of the underfilled solder interconnection grid array residing between a board and a substrate (or module) in accordance with the invention, as compared to the load on conventional solder joints within a non-underfilled solder interconnection grid array residing between a board and substrate (or module). These results show that the underfilled solder joints of the invention advantageously remain relatively unchanged, or undamaged, by the axial forces applied to such underfilled solder joints of the invention along a diagonal (with a 40 pound clamping force). These axial forces include tensile forces (above 0.0 g force on the joint) and compressive forces (below 0.0 g force on the joint) applied from the center of the solder joint interconnection grid array, position A in FIG. 15, to the corner of the solder joint interconnection grid array, position B in FIG. 15. On the contrary, conventional non-underfilled solder joints within a grid array are significantly affected by solder creep, and thus damaged, upon applying compressive forces, particularly at and near the corner solder joints within interconnection grid array as shown in FIG. 15. Accordingly, the preparation of an optimized epoxy encapsulant for the purpose of underfilling an array of solder balls (BGA) connected to both the substrate and board has several advantages over the prior art. Firstly, the underfill material fills the gap created by the solidified solder balls without appreciable gravimetric settling of the silica fillers in the cured epoxy, giving rise to uniform, cured, material properties. The underfilled solder interconnections of the invention are inherently more resistant to mechanically-induced creep which may come as a result of high, sustained loading imposed on the module by the heatsink of other cooling apparatus. Secondly, the addition of the optimized BGA encapsulant 190 will simultaneously afford a greater level of fatigue resistance to the BGA interconnects due to the structural coupling of the chip carrier (substrate 130) and the organic board which minimizes the effective strain at the joints.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for assembling an electronic module comprising:
   attaching a chip to a first surface of a substrate using a first solder interconnection array;
   attaching a board to a second surface of said substrate using a second solder interconnection array such that a space is defined between said board and said substrate having a gap height ranging from about 300 microns to about 900 microns, said second solder interconnection array residing entirely within said space; and
   providing an underfill material within said space after said board has been attached to said substrate but prior to applying compressive forces to said electronic module, said underfill material having a filler material with a particle size ranging from about 32 microns to about 300 microns present in an amount ranging from about 60 to 64 weight percent, said underfill material being in direct contact with both said board and said substrate to maintain said space and optimize integrity of said second solder interconnection array during application of said compressive forces.

2. The method of claim 1 further including providing a mechanical support structure comprising at least one rigid metallic ball within said space.

3. The method of claim 1 further including providing a mechanical support structure comprising a bracket within said space.

4. The method of claim 1 further including providing a mechanical support structure comprising a frame within said space.

5. The method of claim 1 wherein said underfill material partially encapsulates said second solder interconnection array at discrete locations.

6. A method for assembling an electronic module comprising:
   attaching a chip to a first surface of a substrate using a first solder interconnection array;
   attaching an organic board to a second surface of said substrate using a second solder interconnection array thereby defining a space between said organic board and said substrate having a gap height ranging from about 300 microns to about 900 microns, said second solder interconnection array residing entirely within said space;
   depositing an underfill material at discrete locations within said space after said organic board has been attached to said substrate but before applying compressive forces to said electronic module, said underfill material being capable of filling said gap height by contacting both said organic board and said substrateand selected solder joints of said second solder interconnection array for partially encapsulating said second solder interconnection array at said discrete locations; and
   curing said underfill material to form a rigid matrix within said space to maintain and enhance integrity of said second solder interconnection array during application of said compressive forces.

7. The method of claim 6 further including the steps of cleaning surfaces of said organic board and said substrate within said space and heating said organic board followed by depositing said underfill material to increase wetting characteristics of said underfill material and enhance adhesion of said underfill material to said organic board and said substrate.

8. The method of claim 6 further including the step of providing at least one rigid metallic ball within said space to further maintain and enhance integrity of said second solder interconnection array.

9. The method of claim 6 further including the step of providing at least one mechanical support structure selected from the group consisting of a bracket, a frame and a collar within said space to further maintain and enhance integrity of said second solder interconnection array.

10. The method of claim 6 wherein said second solder interconnection array comprises a single melt solder interconnection array.

11. The method of claim 6 wherein said second solder interconnection array comprises a dual melt solder interconnection array.

12. The method of claim 6 wherein said underfill material in its uncured state comprises a polymeric material having a filler material present in an amount ranging from about 60% by weight per solution to about 64% by weight per solution, said filler material having a particle size ranging from about 32 microns to about 300 microns in diameter.

13. The method of claim 12 wherein said underfill material in its uncured state has a density ranging from about 1.5 g/cc to about 2.0 g/cc, a viscosity at 25° C. greater than about 5,000 cP, and a Thixotropic Index ranging from about 1.0 to about 2.0.

14. The method of claim 13 wherein said underfill material in its cured state has a glass transition temperature ranging from about 135° C. to about 145° C., and a dynamic tensile modulus strength at about 25° C. greater than about 5 Gpa.

15. The method of claim 14 wherein said substrate comprises a ceramic substrate, said cured underfill material has a CTE below Tg of about 18 ppm/° C. to about 21 ppm/° C., and a CTE above the Tg of about 85 ppm/° C.

16. The method of claim 14 wherein said substrate comprises a organic substrate, said cured underfill material has a CTE below Tg of about 12 ppm/° C. to about 25 ppm/° C., and a CTE above the Tg of about 70 ppm/° C.

17. An electronic module assembly comprising:
a chip attached to a first surface of a substrate via a first solder interconnection array;
a board attached to a second surface of said substrate via a second solder interconnection array;
a space defined between said organic board and said substrate having a gap height ranging from about 300 microns to about 900 microns, said second solder interconnection array residing entirely within said space; and
a rigid matrix of underfill material only within said space being in direct contact with both said board and said substrate for encapsulating said second solder interconnection array to maintain said space and optimize integrity of said second solder interconnection array, said underfill material having a filler material with a particle size ranging from about 32 microns to about 300 microns present in an amount ranging from about 60 to about 64 weight percent.

18. The assembly of claim 17 further including a creep resistant structure selected from the group consisting of a metallic ball, a bracket, a frame, a collar, and combinations thereof.

19. The assembly of claim 17 wherein said underfill material partially encapsulates said second solder interconnection array at discrete locations.

* * * * *